United States Patent
Fauh et al.

(10) Patent No.: US 7,765,673 B2
(45) Date of Patent: Aug. 3, 2010

(54) METHOD FOR IMPROVING POWER DISTRIBUTION CURRENT MEASUREMENT ON PRINTED CIRCUIT BOARDS

(75) Inventors: Jean-Francois Fauh, Vence (FR); Claude Gomez, Antibes (FR); Andre Lecerf, Nice (FR); Denis G. Roman, La Turbie (FR)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 12/124,388

(22) Filed: May 21, 2008

(65) Prior Publication Data
US 2009/0044403 A1  Feb. 19, 2009

Related U.S. Application Data

(62) Division of application No. 10/707,479, filed on Dec. 17, 2003, now Pat. No. 7,391,620.

(30) Foreign Application Priority Data

Apr. 18, 2003  (EP)  .................................. 03368031

(51) Int. Cl.
*G01R 31/28* (2006.01)
(52) U.S. Cl. .............................. 29/593; 29/852; 29/846; 29/832; 361/760; 324/67; 324/629; 324/690; 324/713; 333/12
(58) Field of Classification Search ................... 29/852; 361/760–763; 333/12; 324/629, 690, 713, 324/715, 67
See application file for complete search history.

(56) References Cited

U.S. PATENT DOCUMENTS

| | | | | |
|---|---|---|---|---|
| 4,896,108 | A * | 1/1990 | Lynch et al. | 324/765 |
| 5,708,400 | A * | 1/1998 | Morris | 333/12 |
| 6,215,290 | B1 * | 4/2001 | Yang et al. | 323/282 |
| 6,337,798 | B1 * | 1/2002 | Hailey et al. | 361/763 |
| 7,219,422 | B2 * | 5/2007 | Wada et al. | 29/842 |

* cited by examiner

*Primary Examiner*—Derris H Banks
*Assistant Examiner*—Jeffrey Carley
(74) *Attorney, Agent, or Firm*—Anthony J. Canale

(57) ABSTRACT

A method and system for improving power distribution and/or current measurement on a printed circuit board is disclosed. According to the invention, a first power plane adapted for current measurement includes a first segment to which a current source is connected and a second segment to which other devices may be connected, forming the current load. A third segment is used to measure the current between the first segment and the second segment through two vias that link two points of the third segment to, preferably, two pads of the external layer. In a preferred embodiment, vias are connected to the first segment so that current flow in the third segment is linear, to improve and simplify current determination. The resistivity between the pair of vias may be computed or estimated using calibrated currents.

3 Claims, 3 Drawing Sheets

METHOD FOR IMPROVING POWER DISTRIBUTION CURRENT MEASUREMENT ON PRINTED CIRCUIT BOARDS

This application is a divisional of U.S. patent application Ser. No. 10/707,479, filed on Dec. 17, 2003, now U.S. Pat. No. 7,391,620.

BACKGROUND OF INVENTION

1. Field of the Invention

The present invention relates generally to printed circuit boards (PCB) populated with power supplies used to furnish DC voltages and DC currents to integrated circuits, and more specifically to a method and system for measuring and/or balancing DC currents flowing from current sources to integrated circuits.

2. Background of the Invention

Current sharing allows a distribution of load current amongst a number of parallel DC to DC converters to increase the current and power delivery to a load by having each of the converters contribute some component of the total current required. Current sharing improves the system transient response by spreading the load over all paralleled converters and improves reliability by reducing their individual power dissipation. With current sharing, each parallel converter contributes approximately a 1/N+1 portion of the load current, when there are a total of N+1 paralleled converters with a minimum of N converters required for providing maximum load current. One converter does not have to contribute a disproportionate amount or reach a current limit before other parallel converters contribute. If some of the paralleled converters should fail, the load current is distributed among the remaining converters and the system continues to operate.

Current sharing can be based on the output current of each of the DC to DC converters or can be based on the current carried by each of the switching devices in each of the converters. When output current or load current is monitored, an output sense resistor is used in each of the parallel regulators. The sense resistor dissipates considerable amounts of power when the converters provide high output currents.

Most commercially available DC converters do not provide current control or current monitoring. Therefore, external sensor circuits and external current sharing controllers are required. Generally, a discrete resistor is used to measure the current. FIGS. 1A and 1B illustrate the use of a discrete resistor to measure current to control DC to DC converters for efficient current sharing. FIG. 1A is a partial cross-sectional view of a printed circuit board 100 and FIG. 1B is a partial plan view of the external upper layer. PCB 100 comprises internal and external conductive layers, usually made of copper, in which wiring tracks may be designed and drawn. PCB 100 includes the conductive plane 105 that is part of the power plane grid implemented in one of the internal conductive layers. The conductive tracks 110 and 115 are part of the external conductive upper layer. Conductive vias 125 are used to electrically connect power plane 105 and conductive track 115, as illustrated. Distributing current through a sufficient number of vias 125 reduces the voltage drop at any given node on the board. Once conductive tracks of the external layers have been designed, PCB 100 is partially covered with an insulative solder mask protective coating 120 to protect the board and to avoid shorts. The parts that are not covered with insulative material are plated so that electronic components may be soldered to the PCB 100. A Pin-In-Hole (PIH) DC to DC converter 130 is connected to conductive track 110 of PCB 100 with pin 135 and a discrete resistor 140 is connected to conductive tracks 110 and 115 as illustrated. An electronic component 145 having a pin 150 connected to the power plane 105 is also shown in FIG. 1.

FIG. 1B illustrates the external upper layer comprising conductive tracks 110 and 115. Each conductive track 110 and 115 end with a pad referred to as 155-1 and 155-2, respectively, on which discrete resistor 140 is soldered. The footprint of discrete resistor 140 is represented by a dotted line. Two further conductive tracks 160-1 and 160-2 are connected to the pads 155-1 and 155-2, respectively, and to a current sharing controller, not represented for clarity. While a single internal power plane is shown on FIG. 1A, it is understood that a PCB generally comprises several internal power and wiring planes, in a multi-layered PCB. The number of internal power planes depends upon the power required and the number of DC to DC converters mounted on the PCB. Distributing current through several internal power planes reduces the voltage drop and therefore current loss.

A standard solution for measuring current between DC to DC converter 130 and power plane 105 consists in removing discrete resistor 140 so as to solder a copper wire between pads 155-1 and 155-2 and to use a current clamp.

To achieve a lower resistor value, two discrete resistors in close proximity may be arranged in parallel. However, using two discrete resistors per converter may increase the dedicated area for such components and the cost of PCB design.

A need exists in the art for a method and system for measuring current at the output of a DC to DC converter and for optimizing current sharing between several DC to DC converters employed on a PCB such that the problems described above are overcome. Particular scrutiny must be given to the additional cost and area required to implement a satisfactory PCB solution.

SUMMARY OF INVENTION

Thus, it is an aspect of the invention to remedy the shortcomings of the prior art as described above.

The present invention is directed toward providing a system and method for measuring the current at the output of a PCB current source. The system and method is capable of determining the total PCB surface area required to measure the current; avoiding generation of thermal hot spots; and having the capability to adapt for controlling current sharing between several current sources.

The accomplishment of these and other related aspects is achieved through a printed circuit board with power plane layers that include a dedicated region for current measurement. Each of these regions includes a first segment for inputting current, a second segment for outputting current and a third segment for connecting the first and second segment. The printed circuit board further comprises at least one pair of conductive vias connected to a different point of the third segment, wherein the current transferred from the first segment to the second segment is determined by measuring the difference of potential between each conductive via.

Further advantages of the present invention will become apparent to those skilled in the art upon examination of the drawings and detailed description. It is intended that any additional advantages be incorporated herein.

BRIEF DESCRIPTION OF DRAWINGS

FIG. 1A is a partial cross-section view of the PCB while FIG. 1B is a partial plan view of its external upper layer.

FIG. 2A is a partial cross-section view of the PCB while FIG. 2B is a partial plan view of an internal layer comprising a power plane.

DETAILED DESCRIPTION

The present invention is directed toward an adapted design of the printed circuit board, particularly the internal power planes, including electrically characterized regions, so that the current on each PCB layer may be efficiently measured without a sense resistor mounted on an external layer. Such characterized regions of the power planes replace dedicated discrete resistors used for local current flow estimation. Since discrete resistors are not required and are replaced by discrete regions of the power planes, the printed circuit board (PCB) surface area dedicated to current measurement and the cost of the PCB may be reduced.

Figure 2A:
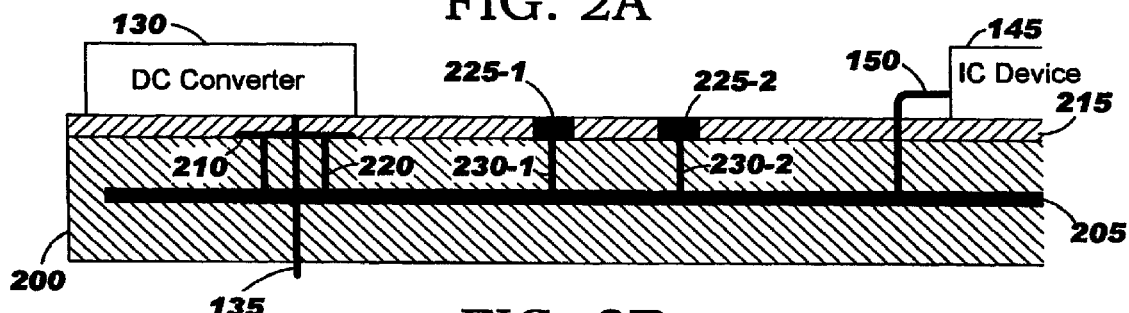
FIGS. 2A-B Illustrate a first embodiment of the present invention for measuring current at the output of a DC to DC converter of a PCB.

FIGS. 2A,B illustrate an example of the implementation of the invention in a PCB for measuring high current (e.g., current between about 20 and 40 amperes) at the output of a single DC to DC converter. FIG. 2A is a partial cross-sectional view of the PCB while FIG. 2B is a partial plan view of one of its internal layer comprising an adapted power plane.

Figure 1A:
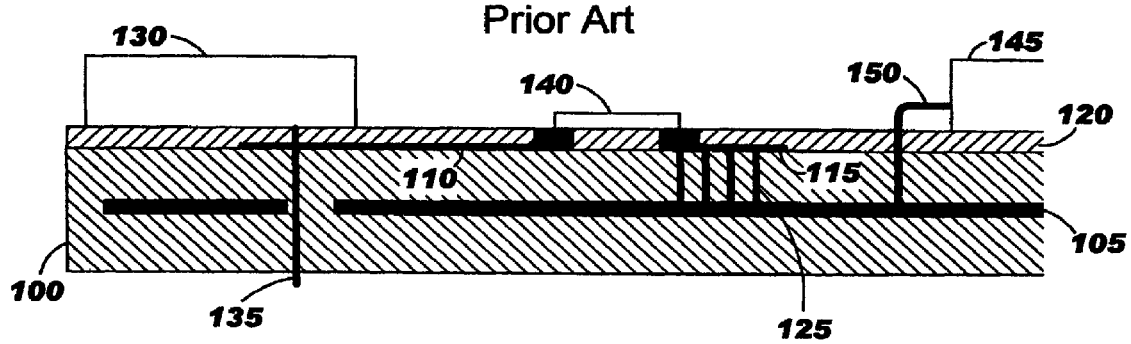
FIGS. 1A-B illustrate a standard solution of the prior art for measuring current at the output of a DC to DC converter and for optimizing current sharing between several DC to DC converters of a PCB.
Figure 1B:
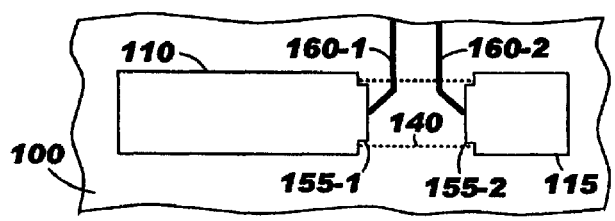

PCB 200 of FIGS. 2A,B includes a power plane 205, designed in an internal conductive layer, and a conductive track 210, designed in the external conductive upper layer. Vias 220, electrically connecting conductive power planes 205 and 210, are used to transfer high current from conductive track 210 to which DC to DC converter 130 is connected to conductive power plane 205. As described by reference to FIG. 1, distributing current through a sufficient number of vias 220 reduces the voltage drop and therefore power loss. Similar to PCB 100, PCB 200 is partially covered with a solder mask 215 after conductive tracks of the external layers have been designed, to protect the board and to avoid shorts. The parts that are not covered with insulative material are plated so that electronic components may be soldered. A Pin In Hole (PIH) DC to DC converter 130 is connected to power plane 205 and conductive track 210 of PCB 200 with pin 135 and therefore linked by pin 135 and vias 220. As mentioned above, a single pin is represented to link DC to DC converter 130 to power plane 205 for sake of illustration, however, DC to DC converter 130 may be connected to power plane 205 by several pins. An electronic component 145 having a pin 150 connected to power plane 205 is shown for purposes of illustration. Two vias 230-1 and 230-2 are connected to power plane 205 and terminate at pads 225-1 and 225-2, respectively, on the external surface of PCB 200.

Figure 2B:
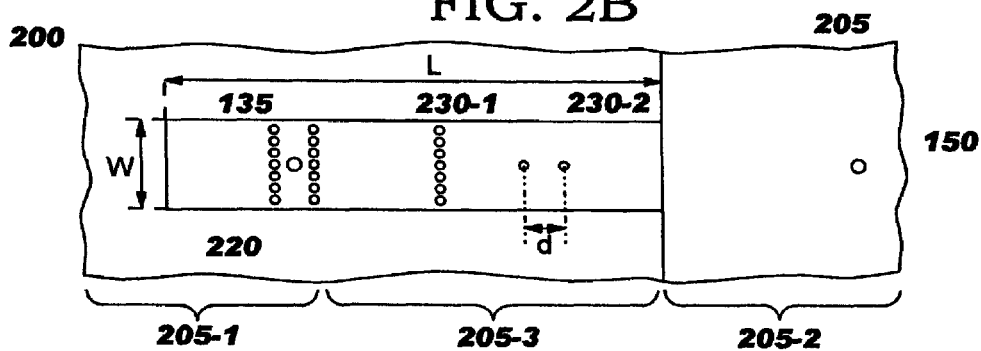

In FIG. 2B, a partial plan view of the internal power plane layer is shown, comprising power plane 205 with geometry adapted to measure DC to DC converter output current by measuring the voltage between vias 230-1 and 230-2 of a dedicated region and using the voltage and resistance values to solve for the current. Power plane 205 is made of two parts, a first part having the shape of a rectangle and a second part to which electronic devices or current loads are connected. The first segment 205-1 is connected to the DC to DC converter 130 and conductive track 210 through pin 135 and vias 220. A second segment 205-2 is connected to the second part of power plane 205-2 to which electronic devices are connected. A third segment 205-3 links the first 205-1 and the second 205-2 segments. The third segment 205-3 is used to measure the current received from the first segment 205-1 and transmitted through the second segment 205-2. Therefore, vias 230-1 and 230-2 belong to the third segment 205-3 of the first part of power plane 205. In order to simplify the computation of the resistivity formed between vias 230-1 and 230-2, vias 220 are arranged in such a way that current flow is linear along the rectangular shape, as illustrated by the arrows. To that end, vias 220 are disposed between the DC to DC converter pin 135 and the vias 225-1 and 225-2, or preferably on each side of the DC to DC converter pin 135, along lines perpendicular to the longer edges of the rectangular shape, as illustrated. Accordingly, for a length equal to L, a width equal to W, a thickness equal to t and the distance between vias 230-1 and 230-2 is equal to d, the resistor R formed between vias 230-1 and 230-2 is determined according to the following relation:

$$R = \rho \cdot \frac{d}{W \cdot t}$$

wherein $\rho$ is the resistivity of copper that varies with the temperature T according to the following equation (first order approximation):

$$\rho(T) = \rho_0 \cdot (1 + a \cdot (T - T_0))$$

with, $\rho_0 = 0.017$ μΩm for copper at $T_0 = 20°$ C. and, $a = 3.8 \times 10-3$ for copper.

Therefore, using equation (1) and Ohm's law, the current may be determined by measuring the voltage between pads 225-1 and 225-2. According to Ohm's relation, $$U = R \cdot i$$

wherein U is the difference of potential and i is the current, and relation (1), the current is determined by the following relation, $$i = \frac{U}{\rho \cdot \frac{d}{w \cdot t}} = \frac{U \cdot W \cdot t}{\rho \cdot d}$$

Utilizing the rectangular region of power plane 205 dedicated to measuring current rather than a discrete resistor avoids generating thermal hot spots. Power is dissipated by the full conductive track instead of the discrete resistor component.

If the temperature cannot be measured, the dedicated portion of power plane 205 may be characterized when the circuit has reached its stable state. To that end, the DC to DC converter 130 is briefly turned off and a calibrated current is input for determining the reference temperature. Then, the DC to DC converter is turned on and the current may be obtained by using a previously determined reference temperature. However, absent an accurate temperature measurement, such a solution is not very precise or practical to use. Another solution includes using a reference conductive land (i.e., a conductive track belonging to the same layer as the dedicated region) that is used only for characterization. Therefore, a calibrated current is input to the reference conductive land for determining a reference temperature that may be used to estimate current in the dedicated region. It is not required to turn off the DC to DC converter nor any other electronic device of the PCB since the reference conductive land is not connected to any functional device of the PCB. This preferred method, also referred to as "test coupon", allows for easy calibration of the resistance formed between pads 230-1 and 230-2.

Even if resistivity of vias 230-1 and 230-2 does not need to be considered when computing resistivity of the power plane 205 between vias 230-1 and 230-2 for measuring high current, it must be taken into account for measuring low current. However, such computations being obvious for a person skilled in the art and being outside the scope of this disclosure are not detailed herein.

Figure 3:
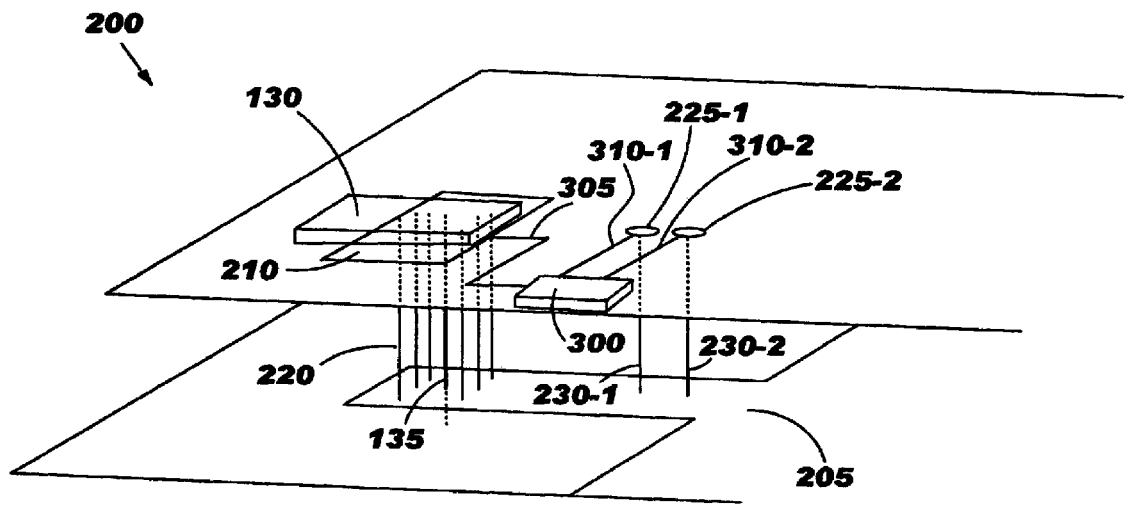
FIG. 3 Shows a partial perspective view of the PCB illustrated on FIGS. 2A and 2B further illustrating a current sharing controller.

Referring to FIG. 3, a current sharing controller 300 may be connected to pads 225-1 and 225-2 to control DC to DC converter 130, particularly when several DC to DC converters are connected in parallel. FIG. 3 represents a partial perspective view of the PCB 200 of FIG. 2 further including a current sharing controller 300. Current sharing controller 300 controls DC to DC converter 130 with a control signal carried along conductive track 305 of the external upper layer. Current sharing controller 300 measures the difference of potential between pads 225-1 and 225-2 through conductive tracks 310-1 and 310-2, respectively, belonging also to the external upper layer. According to Ohm's law, the measured voltage is proportional to the current as explained above, which is used to control DC to DC converter 130 for optimizing output current balancing. Conductive tracks 305, 310-1 and/or 310-2 may be designed in an internal conductive layer. As noted above, resistivity and design of vias 230-1 and 230-2 and conductive tracks 310-1 and 310-2 must be considered for measuring low current but do not present a concern when measuring high current. A first solution to avoid the variation that may be introduced by resistivity and design of vias 230-1 and 230-2 and conductive tracks 310-1 and 310-2, is to use approximately the same circuit geometry and structure for measuring the current of each DC to DC converter. This approach allows the conductive tracks and vias used for measuring the current to have approximately the same shapes and sizes. Moreover, the distances between the points of measure are approximately the same, according to the axis determined by current flow. A second solution handling the variation that may be introduced by resistivity and design of vias 230-1 and 230-2 and conductive tracks 310-1 and 310-2, is to use a compensation circuit adapted to correct current measurements so that the current sharing controller may be used efficiently.

Figure 4:
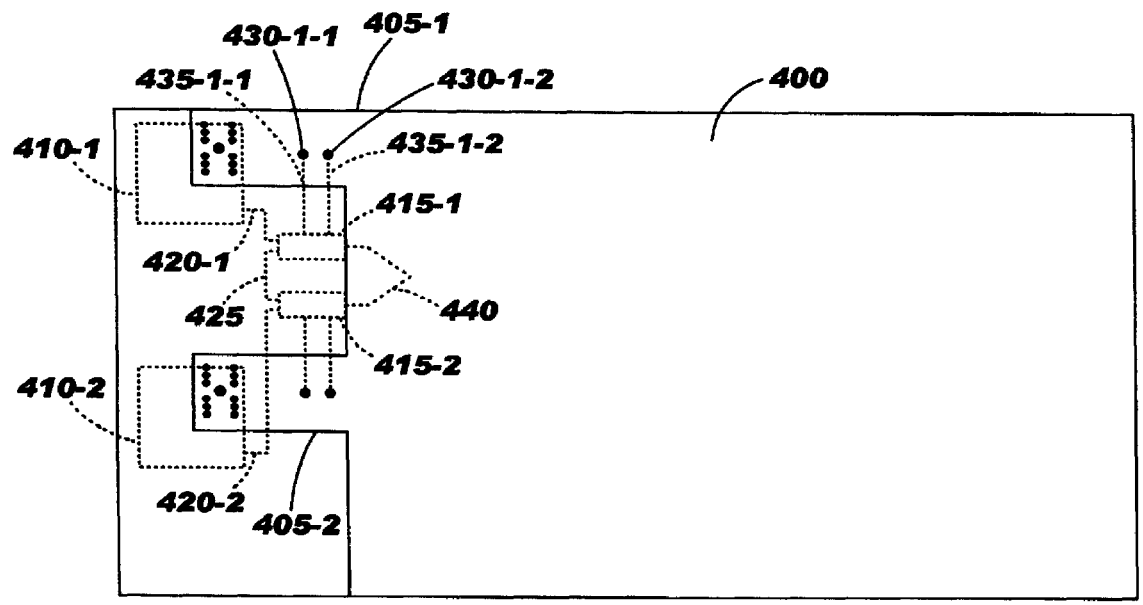
FIG. 4 Shows a first embodiment of a system for optimizing current sharing of two DC to DC converters.

FIG. 4 illustrates a first embodiment of a system for optimizing current sharing of two DC to DC converters, according to the invention. FIG. 4 represents a partial plan view of an internal power plane wherein locations of DC to DC converters, current sharing controllers and several associated signal tracks are shown with dotted lines. Power plane 400 comprises two rectangular shapes 405-1 and 405-2 that are used for measuring current as explained above, to which DC to DC converters 410-1 and 410-2 are connected, respectively. Power plane 400 almost completely overlays the PCB with the exception of rectangular shapes 405-1 and 405-2. To measure output current of DC to DC converters 410-1 and 410-2 and to control them, two current sharing controllers 415-1 and 415-2 are used. Current sharing controllers 415-1 and 415-2 are connected to DC to DC converters 410-1 and 410-2 though signal tracks 420-1 and 420-2, respectively, and are connected together through signal track 425. Current sharing controllers 415-1 and 415-2 are also connected to the dedicated portions of the rectangular shapes 405-1 and 405-2, respectively, of internal power plane 400 for measuring current as detailed above. For example, current sharing controller 415-1 is connected to vias 430-1-1 and 430-1-2 through conductive tracks 435-1-1 and 435-1-2 respectively. Furthermore, current sharing controllers 415-1 and 415-2 are connected to a particular point of the power plane 400, used as a common potential reference, through track 440. Additional power planes may be connected to power plane 400 in a similar manner to the invention, current sharing controllers 415-1 and 415-2 measure the output current of DC to DC converters 410-1 and 410-2 to regulate them. A current sharing controller (e.g., load-share controller UCC39002 from Texas Instruments Incorporated) provides all necessary functions to parallel multiple independent power supplies or DC to DC converters. Targeted for high reliability applications in servers, workstation, telecommunications and other distributed power systems, the controller is suitable for N+1 redundant systems or high current applications where off-the-shelf supplies need to be connected in parallel.

As illustrated in FIG. 4, the structure of the circuits used for measuring the current of each DC to DC converter are approximately the same. For example, rectangular shapes 405-1 and 405-2 are similar, conductive tracks 435-1-1 and 435-1-2 are similar to conductive tracks 435-2-1 and 435-2-2, respectively, vias 430-1-1 and 430-1-2 are similar to vias 430-2-1 and 430-2-2, respectively, and the distance between vias 430-1-1 and 430-1-2, according to the current flow direction, is approximately the same as the distance between the vias 430-2-1 and 430-2-2, still according to the current flow direction. Since the circuit structure used for measuring the current provided by DC to DC converters 410-1 and 410-2 are similar, no compensation circuit is required (variations due to external factors such as manufacturing process or temperature are similar), even for measuring low current.

Figure 5:
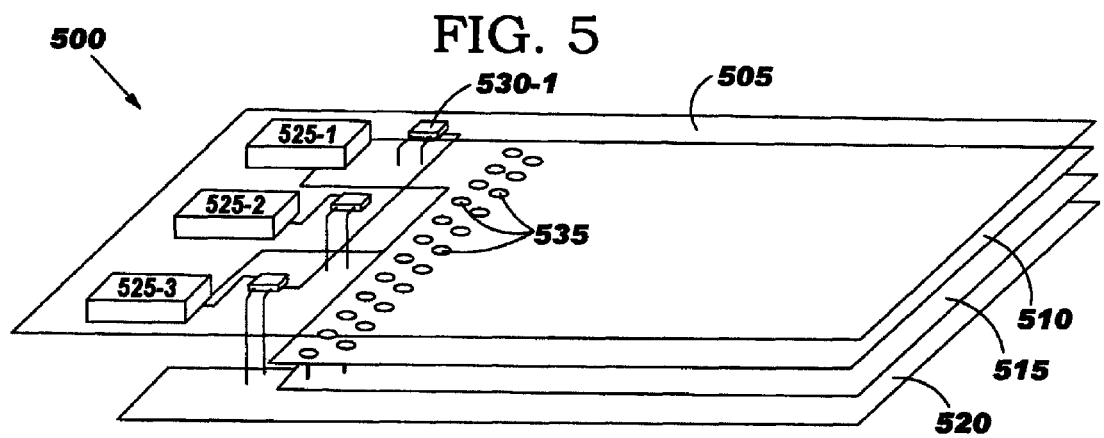
FIG. 5 Shows a second embodiment of a system for optimizing current sharing of several DC to DC converters of a PCB.

FIG. 5 shows a second embodiment of a system for optimizing current sharing of several DC to DC converters of a PCB, according to the invention. In this embodiment, the PCB includes as many internal power planes as DC to DC converters. FIG. 5 is a perspective view of a PCB 500 including an external conductive layer 505 and three internal power plane layers 510, 515 and 520. Each of the internal power plane layers includes a small tab extending from one end of the plane. These shapes are positioned on the same side for each layer of the PCB, and are staggered rather than vertically aligned. In this implementation, three DC to DC converters 525-1, 525-2 and 525-3 are used and soldered on the external conductive layer 505. DC to DC converter 525-1 is connected to the rectangular shape of the power plane of the internal conductive layer 510 with several vias, as discussed above, to create a linear current flow in the dedicated portion of the corresponding rectangular shape. DC to DC converters 525-2 and 525-3 are similarly connected to the rectangular shapes of the power planes of the internal conductive layers 515 and 520, respectively. Each DC to DC converter is connected to an associated current sharing controller e.g., 530-1, that are connected together. Each current sharing controller measures the current in the dedicated region of the rectangular tab shape to which the associated DC to DC converter is connected. As illustrated, all the power planes are electrically connected to each other through a set of vias 535 that are disposed between the rectangular shapes and the remaining portion of each power plane. These vias allow a uniform distribution of current in the power planes, whatever the contribution of each DC to DC converter. A further signal track, not represented for clarity, connects each current sharing controller to a particular point on one of the power planes and is used as a common potential reference. This particular point must be chosen near the vias 535, or on the other side of the vias when considering the rectangular shapes, to provide a measurement not biased by a particular DC to DC converter.

The shape used to establish a current reference for each layer need not be rectangular, but may constitute any shape so long as it is uniform. However, in such a case, it may be necessary to pre-characterize the conductive dedicated portion used to measure current when its resistivity can not be easily computed. To that end, calibrated currents are input in the conductive region at known temperatures. FIGS. 6A, 6B, 6C and 6D illustrate examples of shapes that may be used efficiently to measure current.

Figure 6A:
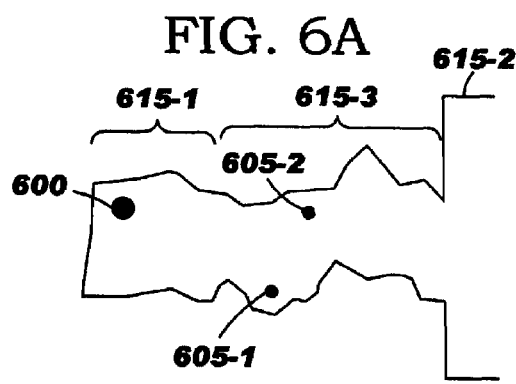
FIGS. 6A-D Depict examples of internal power plane shapes that may be used to measure the output current of a current source and/or to optimize current sharing between current sources.
Figure 6B:
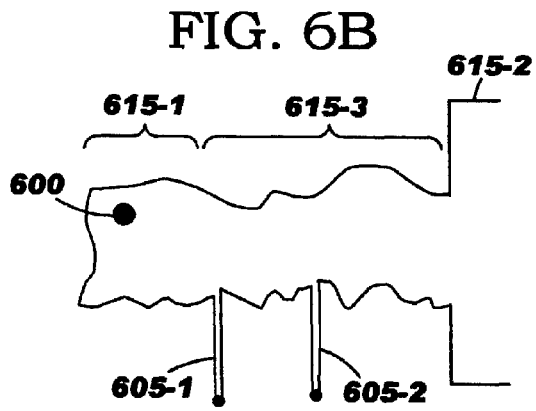

FIGS. 6A and 6B show pseudo-random shapes used for transferring current from a first segment 615-1 wherein current is input with a pin or via 600, to a second segment 615-2 from which current is output to a current-load area, through a third segment 615-3 used for measuring the transferred current. As illustrated, current measurement is accomplished between two measure points of the third segment 615-3, using vias or conductive tracks 605-1 and 605-2, by the method described previously. The current measurement may be absolute to determine its value, or relative to optimize a current source. Referring to FIGS. 6A and 6B, the computation of the resistivity of the third segment 615-3, between the two measure points, is complex. Since determining the resistivity of the third segment 615-3, between the two measure points, is required when performing an absolute current measure and to avoid such complex computations, a lookup table listing calibrated currents may be employed to derive the relation between the current and the measured difference of potential between the measure points. To that end, before using the PCB, several calibrated currents are input sequentially and, for each input current, the difference of potential is measured and stored in a table with a corresponding current value. This table is prepared only once. Then, when using the PCB for its intended purpose, the difference of potential is measured and the corresponding current is determined by referencing the table. To take temperature into account, one of the methods described above may be used. When several circuit structures are used to measure current of different current sources for optimizing purposes, it is not necessary to determine the relation between the current and the measured difference of potential for each measuring circuit structure if the third segment 615-3 used for measuring current is approximately the same in the case of high current or if the measure circuit structures are approximately the same in the case of low current, as explained above.

Figure 6C:
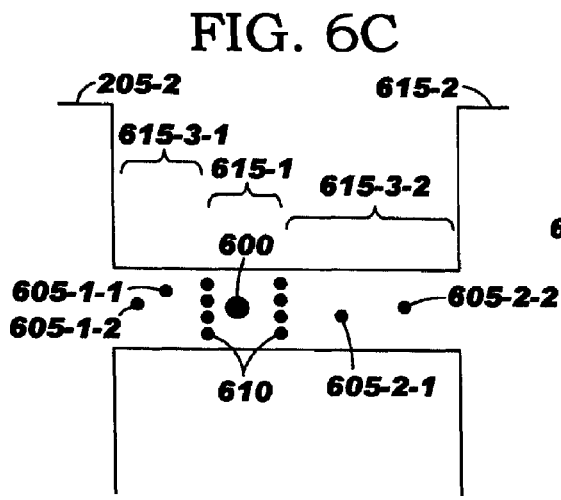

FIG. 6C shows another example of the design of a conductive power plane used for distributing current from a current source to a load. According to the invention, the conductive power plane includes two discrete regions for outputting current, i.e. two different planar regions wherein devices may be connected. These two regions are connected to the first segment 615-1 where current is input with pin or via 600 and the set of vias 610, through two other segments 615-3-1, 615-3-2 used for measuring current by two pairs of vias or conductive tracks 605-1-1 and 605-1-2, and 605-2-1 and 605-2-2, respectively. The set of vias 610 connects the first region where current is input to another conductive track connected to the current source. Therefore, the current that is output from the current source (e.g. DC to DC converter) is distributed among the two regions where devices may be connected, so two current measurements are required. To provide linear current flow lines along the dedicated portions of the power plane wherein measurements are made, vias 610 are disposed on each side of the pin or via 600, as illustrated. Providing a linear path for current flow simplifies the computation of the resistivity between points of measure. The two pairs of vias or conductive tracks, 605-1-1 and 605-1-2, and 605-2-1 and 605-2-2, are disposed between the first region where current is input and the two different regions from which current is output. The current provided by the current source is equal to the sum of the currents measured between vias or conductive tracks 605-1-1 and 605-1-2 and vias or conductive tracks 605-2-1 and 605-2-2.

Figure 6D:
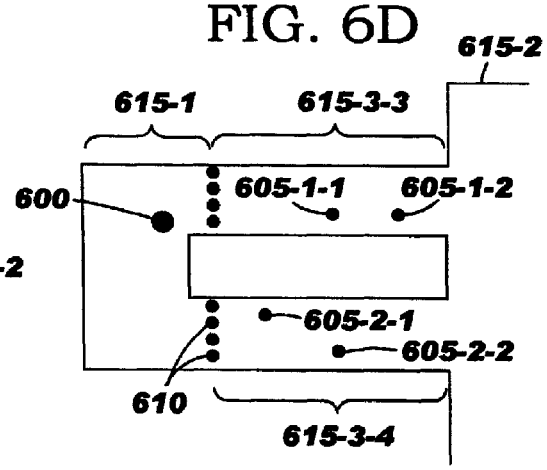

FIG. 6D illustrates another implementation of the present invention where the first segment 615-1 to which the current source is connected and the second segment 615-2 to which other devices may be connected, are linked through two different conductive paths 615-3-3, 615-3-4. In this instance, each of the two conductive paths 615-3-3, 615-3-4 comprise a dedicated portion to measure the current. Two sets of vias 610, connecting the region where current is input to another conductive track also connected to the current source, are used to provide linear current flow lines along these conductive paths. A first pair of vias or conductive tracks 605-1-1 and 605-1-2 is disposed in a first path and a second pair of vias or conductive tracks 605-2-1 and 605-2-2 is disposed in the second path, to measure current. As shown in FIG. 6C, the current provided by the current source is equal to the sum of the currents measured between vias or conductive tracks 605-1-1 and 605-1-2 and between vias or conductive tracks 605-2-1 and 605-2-2.

Although the detailed examples described are based upon PIH devices, it is understood that using other types of devices e.g., surface mount technology (SMT) devices, does not change the method and system of the invention.

While the invention has been described in detail, the foregoing description is in all aspects illustrative and not restrictive. It is understood that numerous other modifications and variations can be devised without departing from the scope of the invention.

The invention claimed is:

1. A method for measuring current on a printed circuit board, the method comprising:
providing a first continuous power plane layer including a first segment for inputting current, a second segment for outputting current and a third segment for connecting said first and second segments, wherein a first electronic component is physically coupled to said first segment, a second electronic component is physically coupled to said second segment and said third segment is not coupled to an electronic component;
providing a pair of adjacent conductive vias comprising corresponding end portions, each of said corresponding end portions terminate upon an upper surface of said first continuous power plane layer, each of said pair of adjacent conductive vias coupled to different points on said third segment of said first continuous power plane layer; and
determining a current transferred from said first segment to said second segment from a potential difference and a resistance between said pair of adjacent conductive vias.

2. The method according to claim 1, wherein said resistance comprises a sheet resistance of a portion of said third segment.

3. The method according to claim 1 further comprising: providing a first current sharing controller on an external layer coupled to said pair of adjacent conductive vias with feedback provided to a first current source to optimize output current balancing.

* * * * *